United States Patent
Yang (10) Patent No.: US 9,484,441 B2
(45) Date of Patent: Nov. 1, 2016

(54) METHOD FOR FABRICATING TRANSISTOR HAVING HARD-MASK LAYER

(71) Applicant: Au Optronics Corporation, Hsinchu (TW)

(72) Inventor: Chao-Shun Yang, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 82 days.

(21) Appl. No.: 14/262,802

(22) Filed: Apr. 27, 2014

(65) Prior Publication Data
US 2015/0200281 A1    Jul. 16, 2015

(30) Foreign Application Priority Data

Jan. 15, 2014  (TW) .............................. 103101470 A (51) Int. Cl.
| | |
|---|---|
| *H01L 29/786* | (2006.01) |
| *H01L 29/66* | (2006.01) |
| *H01L 21/465* | (2006.01) |
| *H01L 21/3213* | (2006.01) |
| *H01L 21/467* | (2006.01) |

(52) U.S. Cl.
CPC ... *H01L 29/66969* (2013.01); *H01L 21/32134* (2013.01); *H01L 21/465* (2013.01); *H01L 21/467* (2013.01); *H01L 29/7869* (2013.01)

(58) Field of Classification Search
CPC ........... H01L 21/467; H01L 21/32134; H01L 29/66765; H01L 29/458; H01L 29/7869
USPC .................................................. 438/104, 158
See application file for complete search history.

(56) References Cited

U.S. PATENT DOCUMENTS

| | | |
|---|---|---|
| 6,362,028 B1 | 3/2002 | Chen et al. |
| 6,780,784 B2 * | 8/2004 | Jo et al. ................. C09K 13/04 |
| | | 216/13 |
| 7,102,718 B1 | 9/2006 | Yamazaki et al. |
| 8,129,717 B2 | 3/2012 | Yamazaki et al. |
| 8,343,817 B2 | 1/2013 | Miyairi et al. |
| 8,729,544 B2 | 5/2014 | Yamazaki et al. |
| 8,729,547 B2 | 5/2014 | Miyairi et al. |
| 8,823,005 B2 * | 9/2014 | Seo et al. .............. H01L 29/458 |
| | | 257/60 |
| 8,946,703 B2 | 2/2015 | Miyairi et al. |
| 9,087,745 B2 | 7/2015 | Yamazaki et al. |

(Continued)

FOREIGN PATENT DOCUMENTS

| | | |
|---|---|---|
| CN | 101640219 | 2/2010 |
| TW | 200938660 | 9/2009 |

(Continued)

*Primary Examiner* — Marcos D Pizarro
(74) *Attorney, Agent, or Firm* — Jianq Chyun IP Office (57) ABSTRACT

A method for fabricating a transistor including the following steps is provided. First, a gate electrode is formed on a substrate, and a gate insulating layer is formed on the substrate in sequence, wherein the gate insulating layer covers the substrate and the gate electrode. Next, a patterned channel layer and a hard-mask layer are formed on the gate insulating layer, wherein the patterned channel layer and the hard-mask layer are located above the gate electrode, and the hard-mask layer is disposed on the patterned channel layer. Afterwards, a source and a drain are formed on the gate insulating layer by a wet etchant. The part of the hard-mask layer that is not covered by the source and the drain is removed by the wet etchant until the patterned channel layer is exposed, so as to form a plurality of patterned hard-mask layers.

8 Claims, 6 Drawing Sheets

(56) References Cited

U.S. PATENT DOCUMENTS

| | | |
|---|---|---|
| 9,111,804 B2 | 8/2015 | Yamazaki et al. |
| 9,166,058 B2 | 10/2015 | Miyairi et al. |
| 2008/0258143 A1* | 10/2008 | Kim et al. .......... H01L 29/458 257/43 |
| 2010/0025678 A1 | 2/2010 | Yamazaki et al. |
| 2010/0035378 A1 | 2/2010 | Chang |
| 2010/0035379 A1 | 2/2010 | Miyairi et al. |
| 2011/0115763 A1 | 5/2011 | Yamazaki et al. |
| 2012/0108006 A1 | 5/2012 | Yamazaki et al. |
| 2012/0108007 A1 | 5/2012 | Yamazaki et al. |
| 2012/0249904 A1 | 10/2012 | Morosawa |
| 2013/0140557 A1 | 6/2013 | Miyairi et al. |
| 2014/0231800 A1 | 8/2014 | Miyairi et al. |
| 2015/0048371 A1 | 2/2015 | Miyairi et al. |
| 2015/0249147 A1 | 9/2015 | Miyairi et al. |
| 2015/0349099 A1 | 12/2015 | Yamazaki et al. |

FOREIGN PATENT DOCUMENTS

| | | |
|---|---|---|
| TW | 201218386 | 5/2012 |
| TW | 201342491 | 10/2013 |

\* cited by examiner

METHOD FOR FABRICATING TRANSISTOR HAVING HARD-MASK LAYER

CROSS-REFERENCE TO RELATED APPLICATION

This application claims the priority benefit of Taiwan application serial no. 103101470, filed on Jan. 15, 2014. The entirety of the above-mentioned patent application is hereby incorporated by reference herein and made a part of this specification.

BACKGROUND OF THE INVENTION

1. Field of the Invention

The invention generally relates to a transistor and a fabrication method thereof, and more particularly to a transistor having an oxide semiconductor channel layer and a fabrication method thereof.

2. Description of Related Art

Recently, as compared to traditional amorphous silicon (a-Si) thin film transistor, since oxide semiconductor thin film transistor encompasses a higher carrier mobility and a more stable threshold voltage (Vth) while being suitable for large area fabrication, it is widely used in display panels gradually.

In general, there are three types of commonly seen oxide semiconductor thin film transistors (TFTs) including Coplanar TFTs, Island Stop/Etch Stop layer (IS/ESL) TFTs, and Back Channel Etch (BCE) TFTs. Among these, the BCE and IS/ESL type oxide semiconductor thin film transistors have advantages in device characteristics and fabrication yield. Moreover, as compared to IS/ESL TFTs, the BCE TFTs can further save one photolithography and etch process (PEP), and thus has an even better advantage.

However, in the fabrication process of the BCE type oxide semiconductor thin film transistors, a photoresist used for patterning a channel layer would be directly in contact with the channel layer. In addition, the photoresist includes organic solvent which would affect the Subthreshold Swing (SS) of the transistors. As a result, the electrical properties and stability of the transistors are compromised.

SUMMARY OF THE INVENTION

The invention provides a transistor and fabrication method thereof, which can reduce damages in a channel layer thereof.

The invention provides a fabrication method of a transistor which includes the following steps. First, a gate electrode is formed on a substrate. Subsequently, a gate insulating layer is formed on the substrate and the gate electrode to cover the substrate and the gate electrode. Next, a patterned channel layer and a hard-mask layer is formed on the gate insulating layer, the patterned channel layer and the hard-mask layer are located above the gate electrode, and the hard-mask layer is located on the patterned channel layer. Afterwards, a source and a drain are formed on the gate insulating layer by a wet etchant. A part of the hard-mask that is not covered by the source and the drain is removed by the wet etchant until the patterning channel layer is exposed so as to form a plurality of patterned hard-mask layers.

In an embodiment of the invention, the material of the aforementioned patterned hard-mask layer is the same as at least part of the material of the source and the drain.

In an embodiment of the invention, the material of the aforementioned patterned hard-mask layer includes metal or tin-free oxide semiconductor, and the material of the patterned channel layer includes tin-containing oxide semiconductor or poly-Indium-Gallium Oxide (poly-IGO).

In an embodiment of the invention, a sheet resistance of the aforementioned patterned channel layer ranges from $10^7$ ohm/unit area to $10^{10}$ ohm/unit area.

In an embodiment of the invention, the aforementioned patterned hard-mask layer, the source, and the drain are formed through etching by the same etchant.

In an embodiment of the invention, the aforementioned wet etchant includes a mixture containing at least two acids selected from sulfuric acid, phosphoric acid, nitric acid, and acetic acid.

In an embodiment of the invention, the aforementioned wet etchant includes sulfuric acid, phosphoric acid, nitric acid, or acetic acid.

In an embodiment of the invention, the aforementioned method for forming the patterned channel layer and the hard-mask layer on the gate insulating layer including: forming a channel material layer and a hard-mask material layer on the gate insulating layer in sequence; forming a first patterned photoresist layer on the hard-mask material layer and using the first patterned photoresist layer as a mask to remove part of the channel material layer and the hard-mask material that is not covered by the first patterned photoresist layer, thereby forming the patterned channel layer and the hard-mask layer; and removing the first patterned photoresist layer.

In an embodiment of the invention, the aforementioned method for forming the source, the drain, and the patterned hard-mask layer including: forming a metal material layer on the patterned channel layer and the hard-mask layer; forming a second patterned photoresist layer on the metal material layer and using the second patterned photoresist layer as a mask to remove the metal material layer that is not covered by the second patterned photoresist layer by the wet etchant, thereby forming the source and the drain; and removing the hard-mask layer located between the source and the drain that is not covered by the second patterned photoresist layer by the wet etchant, thereby forming the patterned hard-mask layer.

In an embodiment of the invention, an etching rate of the source and the drain with the wet etchant is $V_{SD}$, an etching rate of the patterned channel layer with the wet etchant is $V_{CH}$, an etching rate of the hard-mask layer with the wet etchant is $V_{HM}$. And $V_{SD}$, $V_{CH}$, and $V_{HM}$ satisfy the following equations:

$$10 \leq V_{HM}/V_{CH} \leq 100; \text{ and}$$

$$0.1 \leq V_{SD}/V_{HM} \leq 10.$$

The invention provides a transistor, which includes a gate electrode, a gate insulating layer, a patterned channel layer, a plurality of patterned hard-mask layers, a source, and a drain. The gate insulating layer covers the gate electrode. The patterned channel layer is disposed on the gate insulating layer and is located above the gate electrode. A sheet resistance of the patterned channel layer ranges from $10^7$ ohm/unit area to $10^{10}$ ohm/unit area. The patterned hard-mask layers are disposed on the patterned channel layer. The source and the drain are disposed on the gate insulating layer, and the patterned hard-mask layers are respectively disposed between the source and the patterned channel layer, and between the drain and the patterned channel layer.

In an embodiment of the invention, the material of the aforementioned patterned hard-mask layer includes tin-free oxide semiconductor, and the material of the patterned channel layer includes tin-containing oxide semiconductor or poly-Indium-Gallium Oxide (poly-IGO).

In an embodiment of the invention, the material of the aforementioned patterned hard-mask layer includes Indium-Gallium Oxide (IGO), Indium-Zinc Oxide (IZO), Indium-Gallium-Zinc Oxide (IGZO), Al-doped ZnO (AZO), Zinc Oxide (ZnO), Indium Oxide ($In_2O_3$), or Gallium Oxide ($Ga_2O_3$). The material of the patterned channel layer includes Indium-Tin-Zinc Oxide (ITZO), Zinc-Tin Oxide (ZTO), Zinc-Tin Oxide:Indium (ZTO:In), Zinc-Tin Oxide:Gallium (ZTO:Ga), Indium-Gallium-Zinc Oxide:Stannum (IGZO:Sn), Gallium-Tin Oxide (GTO), Indium-Gallium-Tin Oxide (IGTO), or poly-IGO.

In an embodiment of the invention, the aforementioned patterned hard-mask layer exposes part of the patterned channel layer.

Accordingly, the transistor and the fabrication method thereof provided in the invention can prevent the channel layer to be directly in contact with the photoresist, thereby allowing the transistor to have a better subthreshold swing and stability.

To make the above features and advantages of the invention more comprehensible, several embodiments accompanied with drawings are described in detail as follows.

DESCRIPTION OF THE EMBODIMENTS

Figure 1A:
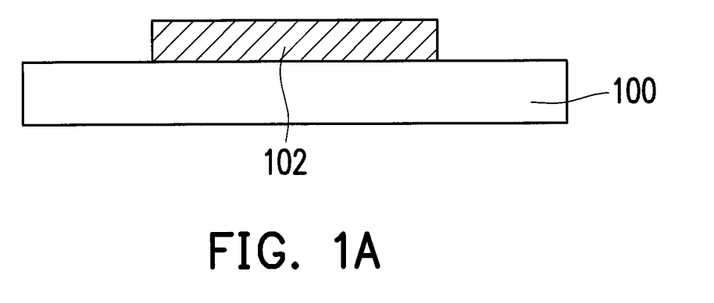
FIG. 1A to FIG. 1G are schematic flow diagrams of the fabrication process of a transistor according to an embodiment of the invention.

FIG. 1A to FIG. 1G are schematic flow diagrams of the fabrication process of a transistor according to an embodiment of the invention. Referring to FIG. 1A, first, a substrate 100 is provided, and a gate electrode 102 is formed on the substrate 100. In the present embodiment, the substrate 100 is, for example, rigid substrate, flexible substrate, or the like. For instances, rigid substrate can be glass substrate, and flexible substrate can be plastic substrate. In addition, the gate electrode 102 is, for example, single layer or stacked multi-layer metal material, and the metal material is, for example, at least one metal selected from a group consisting of the following metals: copper (Cu), Molybdenum (Mo), Titanium (Ti), Aluminum (Al), Tungsten (W), Silver (Ag), Gold (Au), and alloys thereof. The gate electrode 102 can be fabricated by patterning metal material through lithography.

Figure 1B:
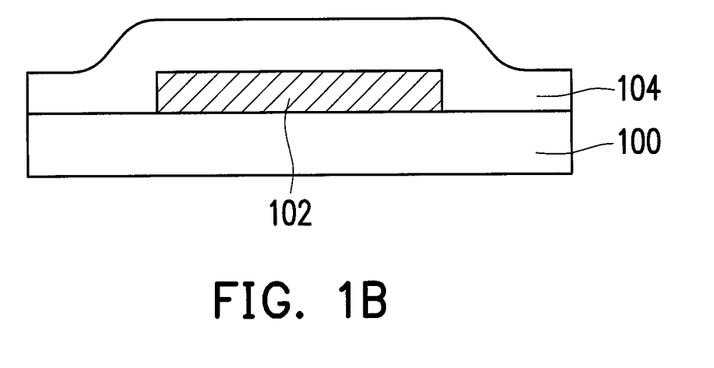

Referring to FIG. 1B, subsequently, a gate insulating layer 104 is formed on the substrate 100 and the gate electrode 102, and the gate insulating layer 104 covers the substrate 100 and the gate electrode 102 simultaneously. In the present embodiment, gate insulating layer 104 can be single layer structure or stacked multi-layer composite structure, and the material of the gate insulating layer 104 is, for example, silicon nitride, silica, silicon oxynitride, or other suitable dielectric materials.

Figure 1C:
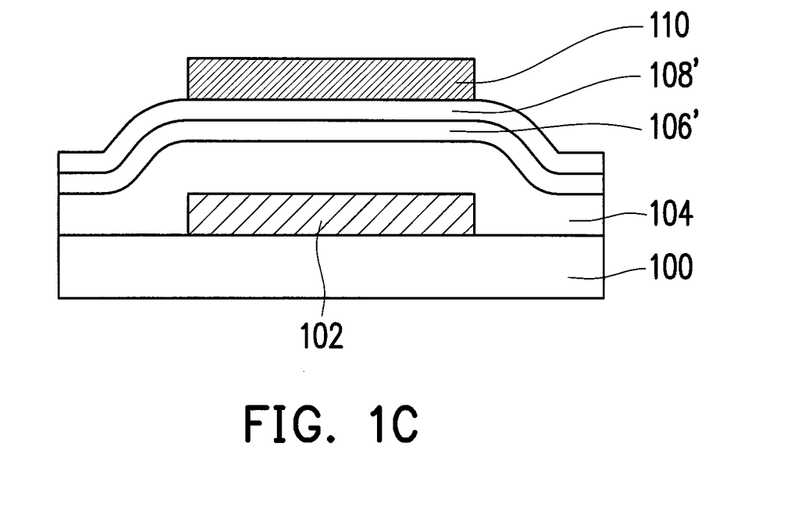

Referring to FIG. 1C, after completing the fabrication of the gate insulating layer 104, a channel material layer 106' and a hard-mask material layer 108' are formed on the gate insulating layer 104. In detail, after the formation of the gate insulating layer 104, the channel material layer 106', the hard-mask material layer 108' and a first patterned photoresist layer 110 are formed on the gate insulating layer 104 in sequence. The channel material layer 106' covers the gate insulating layer 104, the hard-mask material layer 108' covers the channel material layer 106', the first patterned photoresist layer 110 is disposed on partial region of the hard-mask material layer 108', and the first patterned photoresist layer 110 is located above the gate electrode 102.

Figure 1D:
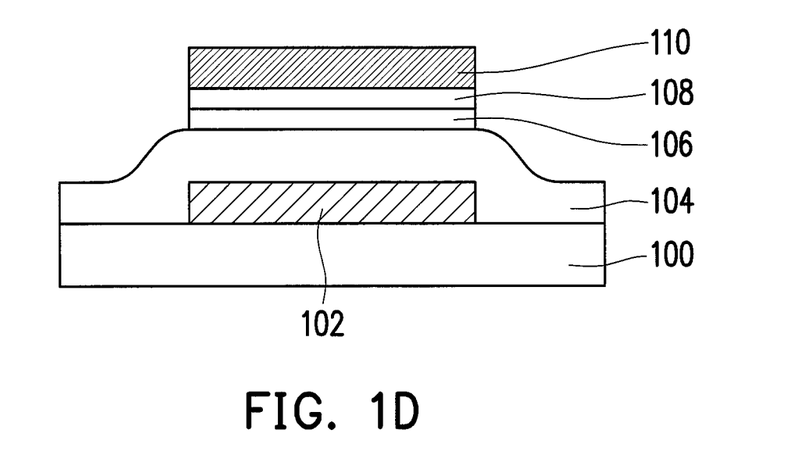

Referring to FIG. 1C and FIG. 1D simultaneously, after the formation of the first patterned photoresist layer 110, the first patterned photoresist layer 110 is used as a mask to remove part of the channel material layer 106' and part of the hard-mask material layer 108' that is not covered by the first patterned photoresist layer 110 to form a patterned channel layer 106 and a hard-mask layer 108. In the present embodiment, since the patterned channel layer 106 is not directly in contact with the first patterned photoresist layer 110, the organic solvent in the first patterned photoresist layer 110 will not easily cause damage to the patterned channel layer 106.

In an embodiment of the invention, the material of the patterned channel layer 106 can include tin-containing oxide semiconductors or poly-IGO, such as ITZO, ZTO, ZTO:In, ZTO:Ga, IGZO:Sn, GTO, IGTO, or the like. A sheet resistance of the patterned channel layer 106 ranges from $10^7$ ohm/unit area to $10^{10}$ ohm/unit area. In addition, the material of the hard-mask layer 108 can include metal or tin-free oxide semiconductor, such as IGO, IZO, IGZO, AZO, ZnO, $In_2O_3$, $Ga_2O_3$, or the like. To simplify the description, explanation below will be based on utilizing ITZO as an example for the material of the patterned channel layer 106 and utilizing IGZO as an example for the material of the hard-mask layer 108, but the invention is not limited thereto.

Figure 1E:
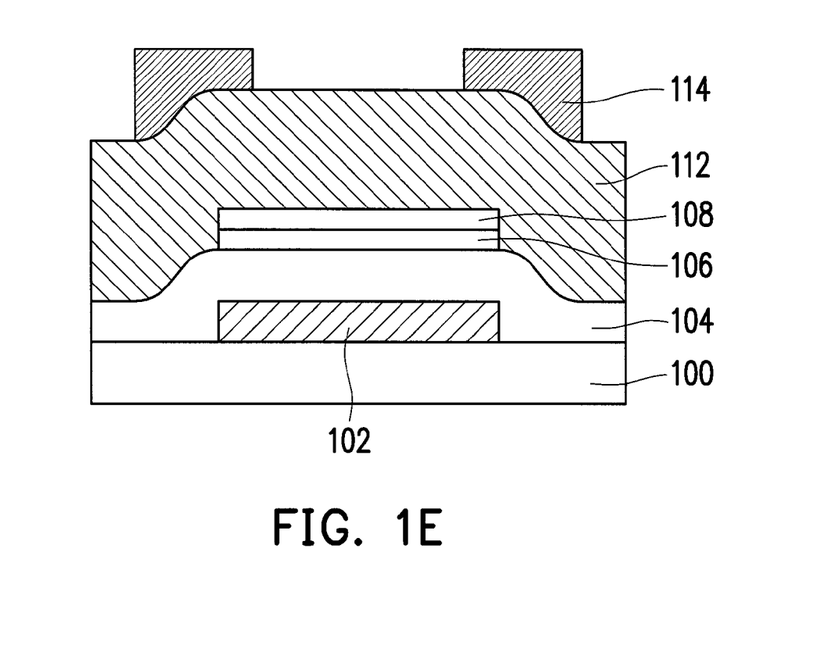

Referring to FIG. 1E, after completing the fabrication of the patterned channel layer 106 and the hard-mask layer 108, the first patterned photoresist layer 110 covering the hard-mask layer 108 is removed. Subsequently, a metal material layer 112 is formed on the hard-mask layer 108 and the gate insulating layer 104. Afterwards, a second patterned photoresist layer 114 is formed on the metal material layer 112, and the second patterned photoresist layer 114 is used to define the pattern of source and drain (not illustrated) formed in subsequent process. As shown in FIG. 1E, the second patterned photoresist layer 114 is disposed on the metal material layer 112 and corresponds to the space on top of part of the hard-mask layer 108 and part of the gate insulating layer 104. As mentioned above, the metal material layer 112 can be a single layer structure or a stacked multi-layer composite structure, and the material thereof is, for example, metal materials such as Aluminum (Al), Molybdenum (Mo), Silver (Ag), Palladium (Pd), or alloys thereof. The material of the metal material layer 112 can be the same as or different from the material of the gate electrode 102. Molybdenum/Aluminum/Molybdenum (Mo/Al/Mo) is being used as an example for the material of the metal material layer 112 to demonstrate the explanations of the embodiment. It is worth to note that in the present embodiment, the metal material layer 112 is not limited to the stacked layer structure of Molybdenum/Aluminum/Molybdenum (Mo/Al/Mo).

Figure 1F:
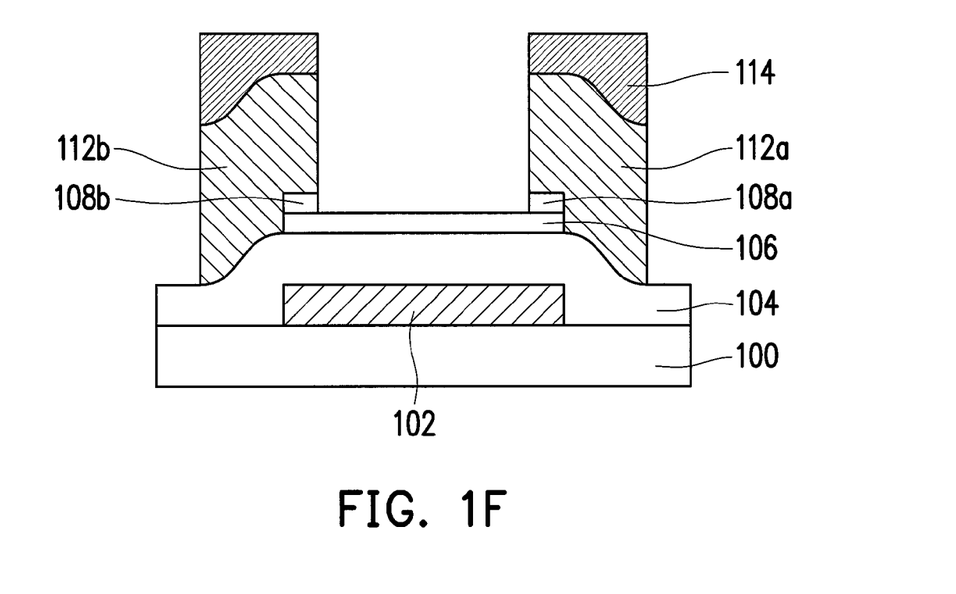

Referring to FIG. 1E and FIG. 1F, after the formation of the second patterned photoresist layer 114, the metal material layer 112 not covered by the second patterned photoresist layer 114 and the hard-mask layer 108 not covered by the second patterned photoresist layer 114 are removed by the wet etchant to complete the fabrication of a source 112a and a drain 112b, thereby allowing the hard-mask layer 108 to be further patterned to form patterned hard-mask layers 108a and 108b. Herein, as shown in FIG. 1F, the amount of the patterned hard-mask layers 108a and 108b are two, but the invention is not limited thereto. Subsequently, as shown in FIG. 1F, the source 112a and the drain 112b are covered on the patterned hard-mask layers 108a, 108b and part of the gate insulating layer 104. Specifically, in an embodiment of the invention, the patterned hard-mask layers 108a and 108b, the source 112a, and the drain 112b can be formed through etching by the same wet etchant. The wet etchant is, for example, sulfuric acid, phosphoric acid, nitric acid, acetic acid, or a mixture containing at least two acids of the above compounds. In other embodiment, the wet etchant can also be aluminum etchant. The aluminum etchant is a mixture containing at least phosphoric acid, acetic acid and nitric acid. In other words, when an etching rate of the source 112a and the drain 112b with the wet etchant is $V_{SD}$, an etching rate of the patterned channel layer 106 with the wet etchant is $V_{CH}$, and an etching rate of the hard-mask layer 108 with the wet etchant is $V_{HM}$, then $V_{SD}$, $V_{CH}$, and $V_{HM}$ satisfy the following equations:

$$10 \leq V_{HM}/V_{CH} \leq 100; \text{ and}$$

$$0.1 \leq V_{SD}/V_{HM} \leq 10.$$

Figure 1G:
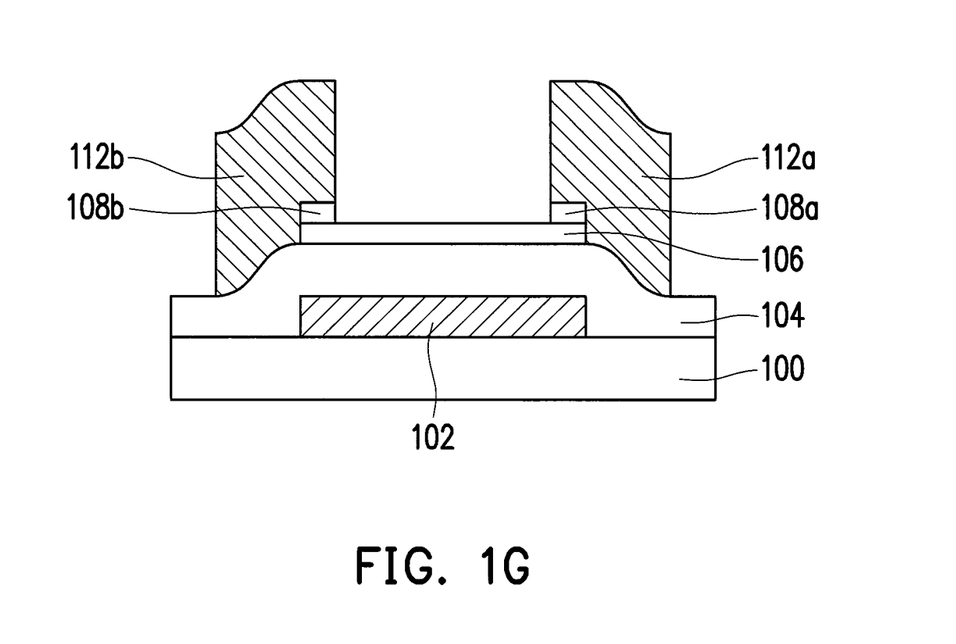

Referring to FIG. 1F and FIG. 1G simultaneously, after the formation of the source 112a and the drain 112b, the second patterned photoresist layer 114 is removed to preliminarily complete the fabrication of the transistor. As shown in FIG. 1G, the transistor of the present embodiment includes the gate electrode 102, the gate insulating layer 104, the patterned channel layer 106, the patterned hard-mask layers 108a and 108b, a source 112a, and a drain 112b. The gate insulating layer 104 covers the gate electrode 102. The patterned channel layer 106 is disposed on the gate insulating layer 104 and is located above the gate electrode 102. The sheet resistance of the patterned channel layer 106 ranges from $10^7$ ohm/unit area to $10^{10}$ ohm/unit area. The patterned hard-mask layers 108a and 108b are disposed on the patterned channel layer 106. The source 112a and the drain 112b are disposed on the gate insulating layer 104, and the patterned hard-mask layers 108a and 108b are located between the source 112a and the patterned channel layer 106 and between the drain 112b and the patterned channel layer 106.

Figure 2:
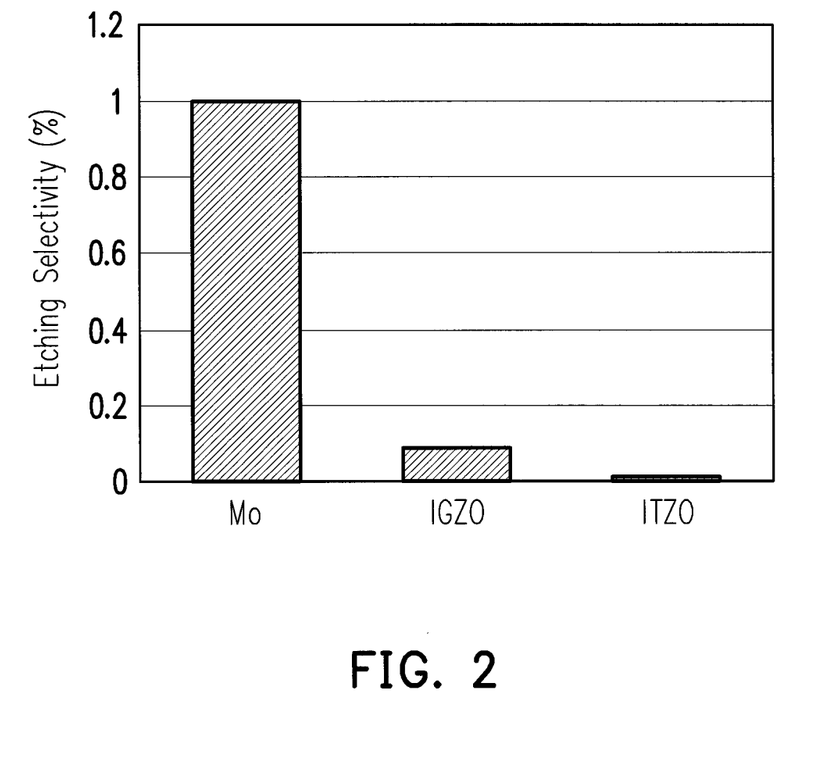
FIG. 2 is the etching selectivity of aluminum etchant with respect to molybdenum, IGZO, and ITZO, respectively at 40° C.

FIG. 2 is the etching selectivity of aluminum etchant with respect to molybdenum, IGZO, and ITZO, respectively at 40° C. Referring to FIG. 1E, FIG. 1F, and FIG. 2 simultaneously, under the circumstance of 40° C., the etching rate of Mo with aluminum etchant is V1, the etching rate of IGZO with aluminum etchant is V2, the etching rate of ITZO with aluminum etchant is V3, and V1:V2:V3 is 1:0.1:0.001. In other words, when the material of the source 112a and the drain 112b is Mo/Al/Mo, the material of the hard-mask layer 108 is IGZO, and the material of the patterned channel layer 106 is ITZO, the aluminum etchant can effectively etch the metal material layer 112 and the hard-mask layer 108 to form the source 112a, the drain 112b, and the patterned hard-mask layers 108a, 108b while not excessively damage the patterned channel layer 106.

For example, when the hard-mask layer 108 is formed of a thickness of 10-40 nm, the metal material layer 112 is formed of a thickness of 400-500 nm, then the part of the hard-mask layer 108 not covered by the second patterned photoresist layer 114 (namely, the part of the hard-mask layer 108 not covered by the aforementioned source 112a and the drain 112b) will be removed until the patterned channel layer 106 is exposed. That is, the hard-mask layer 108 exposes part of the patterned channel layer 106, and the hard-mask layer 108 is being etched to form two separate parts of patterned hard-mask layers 108a and 108b. At this time, after removing the second patterned photoresist layer 114, a transistor structure is obtained, as shown in FIG. 1G.

Moreover, in another embodiment of the invention, the material of the hard-mask layer 108 is the same as at least part of the material of the source 112a and the drain 112b, and the examples are metal materials such as Al, Mo, Ag, Pd, or alloys thereof. As mentioned above, the hard-mask layer 108, the source 112a, and the drain 112b can be formed through etching by the same etchant, and the details may not be repeated herein.

Figure 3A:
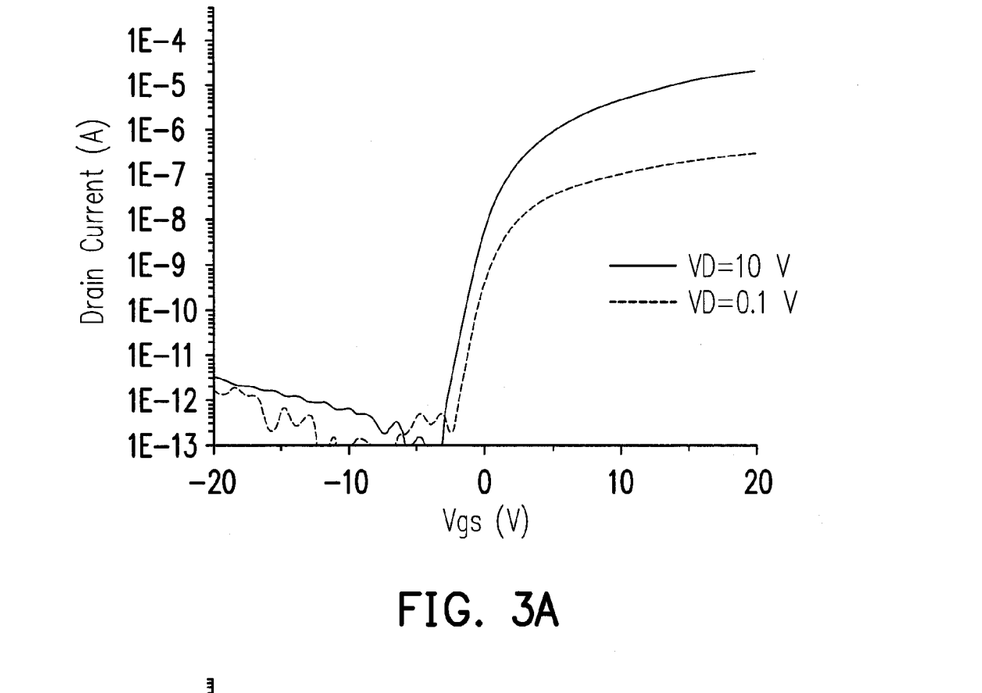
FIG. 3A is a characteristic curve diagram of a transistor according to an embodiment of the invention.
Figure 3B:
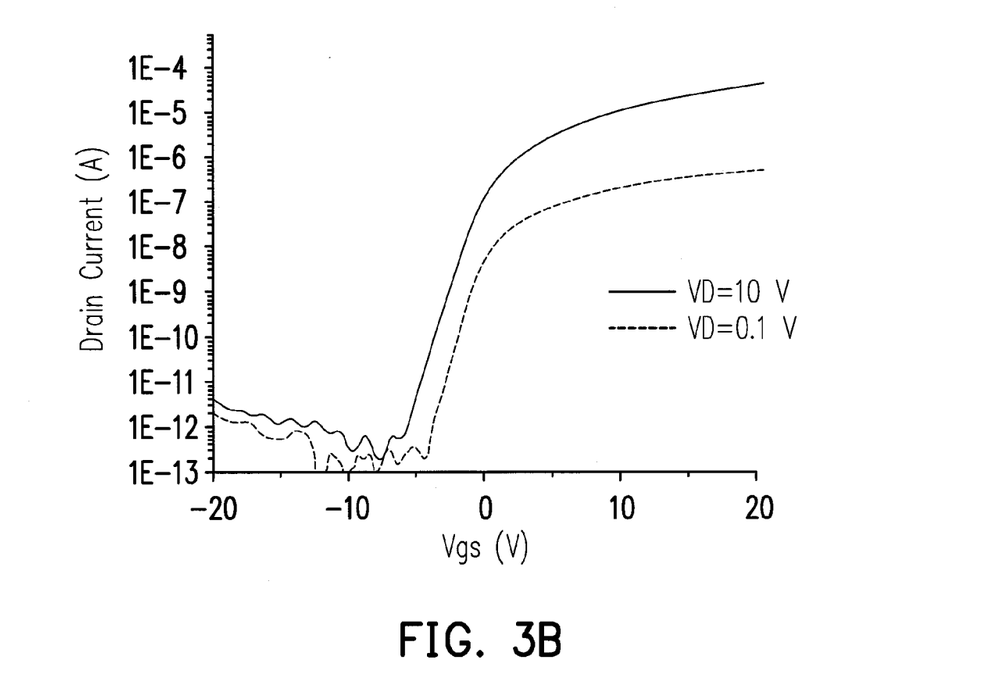
FIG. 3B is a characteristic curve diagram of a conventionally known transistor.

FIG. 3A is a characteristic curve diagram of a transistor according to an embodiment of the invention. The material of the patterned channel layer of the transistor according to the invention is ITZO, and the material of the patterned hard-mask layer is IGZO. FIG. 3B is a characteristic curve diagram of a conventionally known transistor. The material of the patterned channel layer of the conventionally known transistor is ITZO, but the conventionally known transistor does not include a patterned hard-mask layer. Referring to FIG. 3A and FIG. 3B, a drain-source voltage of 0.1V or 10V is applied between the source and the drain, and the drain current corresponding to the change in gate-source voltage from −20V to +20V is measured. The diagrams are drawn such that the y-axis represents the drain current (Id) of the transistor while the x-axis represents the gate-source voltage (Vgs) of the transistor. Herein, the values of subthreshold swing (S.S.), the threshold voltage (Vt), and the field-effect mobility (Ufe) of the transistor according to an embodiment of the invention and the conventionally known transistor are extracted and presented in the following Table 1:

TABLE 1

| | Subthreshold Swing (S.S.) | Threshold Voltage (Vt) | Field-Effect Mobility (Ufe) |
|---|---|---|---|
| Transistor of the invention | 0.26 | −0.75 | 25.7 |
| Conventionally known transistor | 0.83 | −2.67 | 26.7 |

Unit: Volts

Referring to Table 1, the value of subthreshold swing and threshold voltage of the transistor according to the invention are smaller than that of the conventionally known transistor while the field-effect mobility is hardly being affected. In other words, since the patterned channel layer of the transistor according to the invention is not directly in contact with the patterned photoresist layer, the organic solvent in the patterned photoresist layer will not easily cause damage to the patterned channel layer. Therefore, as compared to the conventionally known transistor, the transistor according to the invention can encompass better parameters values of subthreshold swing and threshold voltage while the field-effect mobility is hardly being affected.

Accordingly, the transistor and the fabrication method thereof provided in the invention can prevent the channel layer to be directly in contact with the photoresist, thereby allowing the transistor to have a better subthreshold swing and threshold voltage.

It will be apparent to those skilled in the art that various modifications and variations can be made to the structure of the present invention without departing from the scope or spirit of the invention. In view of the foregoing, it is intended that the present invention covers modifications and variations of the invention provided they fall within the scope of the following claims and their equivalents.

What is claimed is:

1. A method for fabricating a transistor, comprising:
   forming a gate electrode on a substrate;
   forming a gate insulating layer on the gate electrode and the substrate to cover the substrate and the gate electrode;
   forming a patterned channel layer and a hard-mask layer on the gate insulating layer, wherein the patterned channel layer and the hard-mask layer are disposed above the gate electrode, and the hard-mask layer is located on the patterned channel layer; and
   forming a source and a drain on the gate insulating layer by a wet etchant and removing part of the hard-mask layer that is not covered by the source and the drain by the wet etchant until the patterned channel layer is exposed, so as to form a plurality of patterned hard-mask layers, wherein a material of the patterned hard-mask layer is the same as a material of the source and the drain.

2. The method for fabricating a transistor according to claim 1, wherein a sheet resistance of the patterned channel layer ranges from $10^7$ ohm/unit area to $10^{10}$ ohm/unit area.

3. The method for fabricating a transistor according to claim 1, wherein an etching rate of the source and the drain with the wet etchant is $V_{SD}$, an etching rate of the patterned channel layer with the wet etchant is $V_{CH}$, an etching rate of the hard-mask layer with the wet etchant is $V_{HM}$, and $V_{SD}$, $V_{CH}$, and $V_{HM}$ satisfy the following equations:

$$10 \leq V_{HM}/V_{CH} \leq 100; \text{ and}$$

$$0.1 \leq V_{SD}/V_{HM} \leq 10.$$

4. The method for fabricating a transistor according to claim 1, wherein the method for forming the patterned channel layer and the hard-mask layer on the gate insulating layer comprises:
   forming a channel material layer and a hard-mask material layer on the gate insulating layer in sequence;
   forming a first patterned photoresist layer on the hard-mask material layer, and using the first patterned photoresist layer as a mask to remove part of the channel material layer and the hard-mask material that is not covered by the first patterned photoresist layer, thereby forming the patterned channel layer and the hard-mask layer; and
   removing the first patterned photoresist layer.

5. The method for fabricating a transistor according to claim 4, wherein the method for forming the source, the drain, and the patterned hard-mask layer comprises:
   forming a metal material layer on the patterned channel layer and the hard-mask layer;
   forming a second patterned photoresist layer on the metal material layer and using the second patterned photoresist layer as a mask to remove the metal material layer that is not covered by the second patterned photoresist layer by the wet etchant, thereby forming the source and the drain; and
   removing the hard-mask layer located between the source and the drain that is not covered by the second patterned photoresist layer by the wet etchant, thereby forming the patterned hard-mask layer.

6. The method for fabricating a transistor according to claim 1, wherein the patterned hard-mask layer, the source, and the drain are formed through etching by the same etchant.

7. The method for fabricating a transistor according to claim 6, wherein the wet etchant comprises a mixture containing at least two acids selected from sulfuric acid, phosphoric acid, nitric acid, and acetic acid.

8. The method for fabricating a transistor according to claim 6, wherein the wet etchant comprises sulfuric acid, phosphoric acid, nitric acid, or acetic acid.

* * * * *